US006191955B1

(12) United States Patent
Guillot et al.

(10) Patent No.: US 6,191,955 B1
(45) Date of Patent: Feb. 20, 2001

(54) ENCAPSULATION AND ENCLOSURE OF ELECTRONIC MODULES

(75) Inventors: Joe Guillot; Michael Quan Dinh, both of Plano; Bill Roberts, Greenville; Linda M. McLemore, Dallas, all of TX (US)

(73) Assignee: Dallas Semiconductor Corporation, Dallas, TX (US)

( * ) Notice: Under 35 U.S.C. 154(b), the term of this patent shall be extended for 0 days.

(21) Appl. No.: 09/010,015

(22) Filed: Jan. 21, 1998

Related U.S. Application Data

(60) Continuation of application No. 08/695,443, filed on Aug. 12, 1996, now Pat. No. 5,749,143, which is a division of application No. 08/330,764, filed on Oct. 28, 1994, now abandoned.

(51) Int. Cl.[7] .......................... H01L 23/053; H01L 23/28

(52) U.S. Cl. .......................... 361/820; 361/760; 361/772; 361/783; 361/810; 361/812; 257/687; 257/704; 257/787; 257/924; 174/52.2; 174/52.4; 29/841; 29/855; 438/126; 438/127; 264/272.14; 264/272.17; 264/272.21; 264/276

(58) Field of Search .................................... 361/760, 772, 361/773, 782, 783, 810–812, 820; 257/667, 687, 704, 787, 788, 789, 795, 924; 174/52.2, 52.3, 52.4, 52.5; 29/841, 855, 856, 883; 438/124, 126, 127; 264/272.11, 272.14, 272.15, 272.17, 272.21, 276

(56) References Cited

U.S. PATENT DOCUMENTS

| | | | | |
|---|---|---|---|---|
| 3,575,546 | * | 4/1971 | Liautaud | 174/52.2 |
| 4,272,644 | * | 6/1981 | Visser et al. | 174/52.4 |
| 4,506,238 | * | 3/1985 | Endoh et al. | 257/787 |
| 4,529,755 | * | 7/1985 | Nishikawa et al. | 257/795 |
| 4,722,027 | * | 1/1988 | Hayakawa | 361/820 |
| 5,119,269 | * | 6/1992 | Nakayama | 361/820 |
| 5,165,055 | * | 11/1992 | Metsler | 333/12 |
| 5,181,097 | * | 1/1993 | Ogata et al. | 257/788 |
| 5,289,034 | * | 2/1994 | Hundt | 257/924 |
| 5,589,714 | * | 12/1996 | Howard | 257/788 |
| 5,641,997 | * | 6/1997 | Ohta et al. | 257/788 |
| 5,917,246 | * | 6/1999 | Kasuya et al. | 257/787 |

* cited by examiner

Primary Examiner—Jeffrey Gaffin
Assistant Examiner—John B. Vigushin
(74) Attorney, Agent, or Firm—Jenkens & Gilchrist, A Professional Corporation

(57) ABSTRACT

An electronic module comprises (a) an electrical assembly of electrical components and a cap. The cap surrounds a portion of the electrical assembly of electrical components to form a pocket between a portion of the electrical assembly of electrical components and the cap. The cap has at least one sidewall, each of the at least one sidewalls having an end, one of at least one sidewalls proximately positioned to at least one electrical lead and having at least one notch positioned in the end, the pocket filled with an encapsulant. A process comprises providing a cap and filling the cap with encapsulant, placing an electrical assembly of electrical components in the cap filled with the preselected amount of encapsulant, and allowing the electrical assembly to seat to a proper depth.

9 Claims, 5 Drawing Sheets

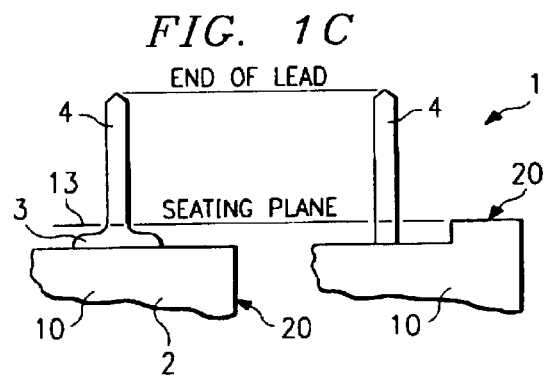
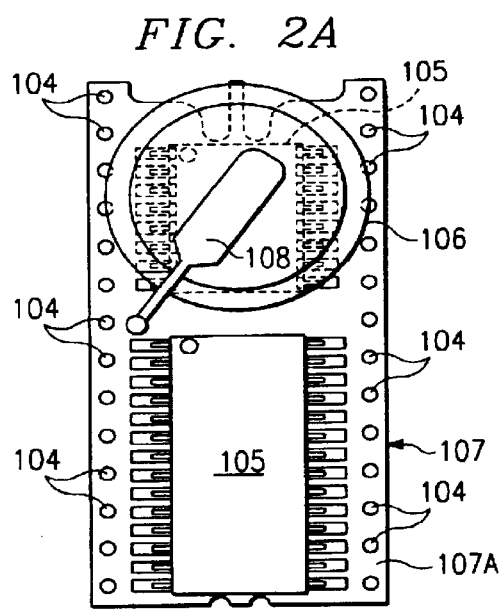
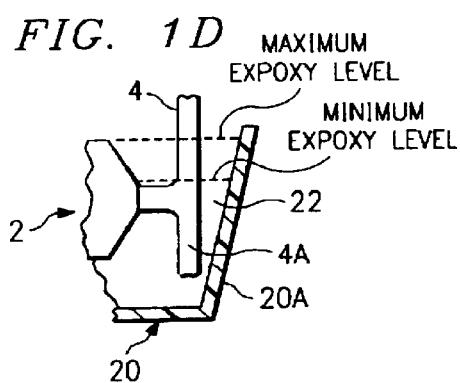
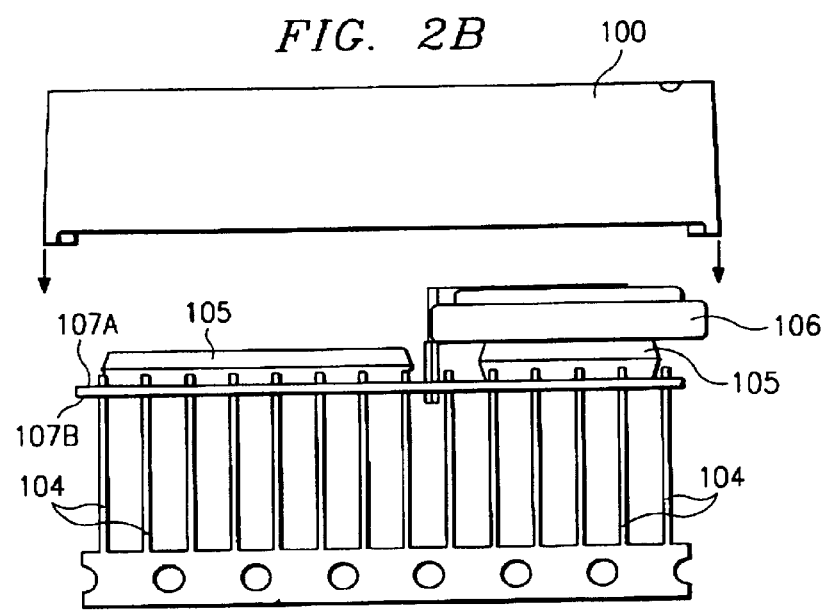

FIG. 3C1
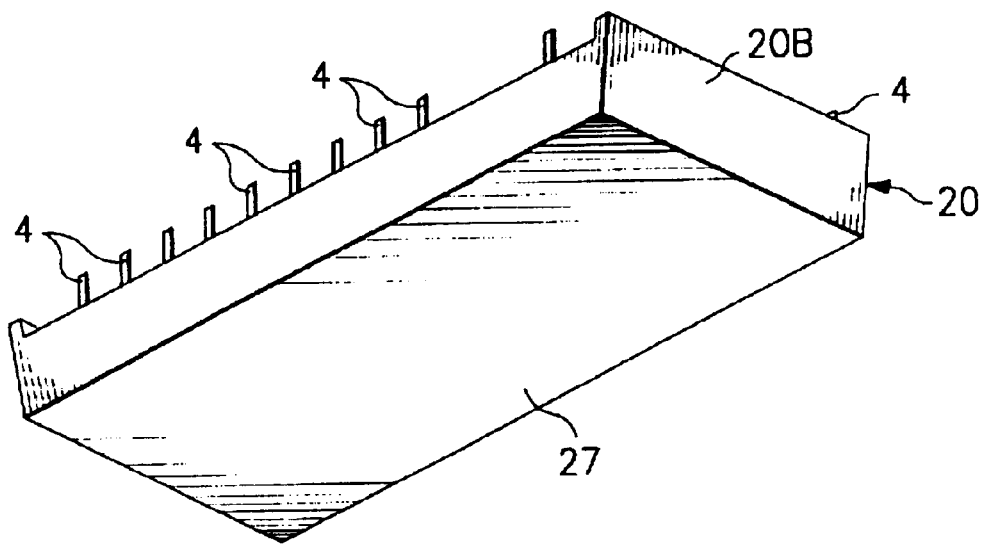
FIG. 3C2
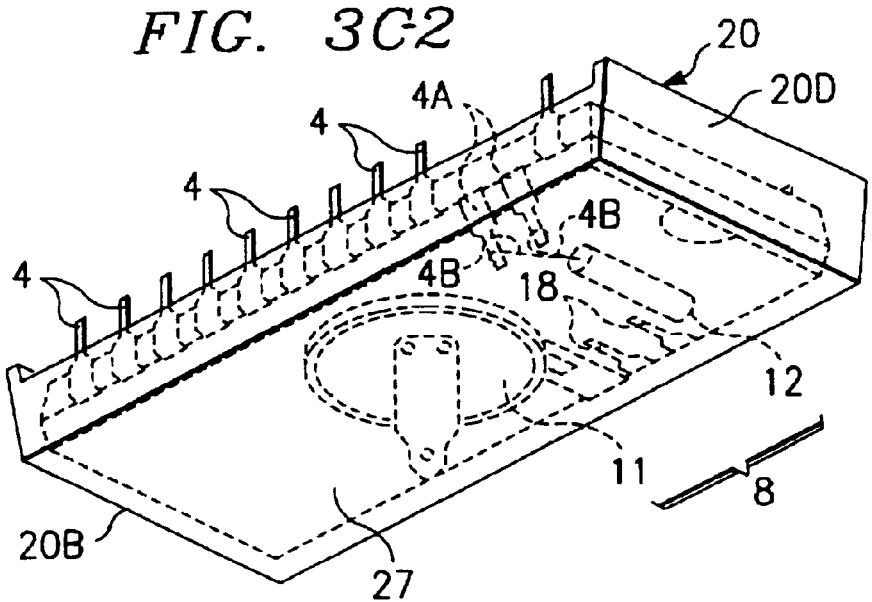

ENCAPSULATION AND ENCLOSURE OF ELECTRONIC MODULES

This application is a continuation of U.S. patent application Ser. No. 08/695,443 filed Aug. 12, 1996 (now U.S. Pat. No. 5,749,143) which was a divisional of U.S. patent application Ser. No. 08/330,764, filed Oct. 28, 1994, now abandoned.

PARTIAL WAIVER OF COPYRIGHT PURSUANT TO 1077 O.G. 22(3/20/87)

© Copyright, Dallas Semiconductor Corporation 1994. All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

CROSS-REFERENCE TO OTHER MATERIALS

Applicants also incorporate by reference the mechanical drawings showing typical pin allotments and measurements for various packages for various identified products manufactured by Dallas Semiconductor Corporation.

FIELD OF INVENTION

The present invention relates generally to improved systems and methods pertaining to electronic circuit enclosure and, more particularly, to the design of housings for electronic modules and module assembly manufacturing procedures.

BACKGROUND

Circuit enclosure systems are typically electronic modules that physically enclose and/or combine together a multitude of electrical components, such as memory devices and batteries. Existing circuit enclosure systems and corresponding manufacturing procedures create a number of problems that often render existing circuit enclosure systems inoperable and/or otherwise add significant manufacturing costs to existing circuit enclosure systems. In particular, existing manufacturing techniques often produce electronic modules that have epoxy covering large portions of the electrical leads connecting the circuit enclosure system with external electrical contacts. The presence of this epoxy weakens, if not completely undermines, the desired electrical connection between the electrical lead and external electrical contacts (e.g., printed circuit boards, sockets, etc.) that electrically couple circuits embedded in the circuit enclosure systems to other, larger electrical systems. As a result, this epoxy must be removed or parts having epoxy covering portions of the electrical leads must be discarded. Existing epoxy removal techniques are expensive and time consuming, especially in terms of labor.

SUMMARY OF THE INVENTIONS

The present invention provides an improved circuit enclosure system and enhanced processes to manufacture the improved circuit enclosure system. Preferred embodiments of the circuit enclosure system or electronic module are comprised of an electrical assembly of electrical components (e.g., integrated circuits, such as non-volatile controller, timekeeping, and/or memory circuits, lithium batteries, oscillator crystals) and a cap or tub. At least one electrical component of the electrical assembly of electrical components comprises an integrated circuit packaged in a first package having at least one electrical lead electrically coupled to the integrated circuit and extending outward and away from the first package and the electrical assembly of electrical components. The cap surrounds a portion of the electrical assembly of electrical components to form a pocket or cavity between a portion of the electrical assembly of electrical components and the cap. The cap in preferred embodiments has at least one sidewall (e.g., four sidewalls) connected to a bottom surface (or the top surface, depending upon your perspective). Each of the at least one sidewalls having an end connected to the bottom surface and another end. One of the at least one sidewalls is proximately positioned to the at least one electrical lead and has at least one notch positioned in the end. Alternate preferred embodiments may have a cap that has a smooth surface, so that there is not a clear line of demarcation between the bottom surface and the side sidewall(s), which is typically the case when the cap is a hollow rectangular or cube structure with an open end, which allows objects to be placed therein. The cap is preferably comprised of injection molded plastic. The pocket is preferably filled with a sealing material or an encapsulant (e.g., epoxy). Packages in preferred embodiments of the module are generally dual in-line package ("DIP") having four sides and said at least one electrical lead is comprised of a first plurality positioned on one side of the four sides and the second plurality of electrical leads positioned on another side of the four sides that are opposite the one side of the four sides. In these embodiments, a plurality of leads extend from opposite sides of the DIP. One or more notches preferably extend alongside the first plurality of the electrical leads and alongside the second plurality of electrical leads. The electrical lead(s) electrically couples at least one electrical component of said electrical assembly to a printed circuit board (i.e., motherboard) using standard surface mount technology and/or through holes (e.g. soldered, wired, etc.), which, in turn, electrically couples said electrical assembly to a second electrical assembly of electrical components (e.g., a personal computer system). The module may be directly connected to printed circuit board via a wired or solder connection or indirectly via a socket configured to accept the electrical leads of the module. The encapsulant in preferred embodiments is an epoxy (e.g., potting epoxy, such as that manufactured by Grace Corporation), and is typically used to provide mechanical support for all the electrical components enclosed therein and help hold all the components together. In addition, encapsulant provides a substantially water tight (or degrading cleaning solvent tight), sealed overall assembly. The encapsulant absorbs the battery electrolytes to extend the life of the battery. This absorption minimizes dendrite growth between the electrodes of the battery or between other surfaces having potential differences.

Preferred processes of assembling the module are generally comprised of the following steps (a) providing a cap, (b) filling the cap with a preselected amount of encapsulant, and (c) placing an electrical assembly of electrical components in the cap filled with the preselected amount of the encapsulant and allowing the electrical assembly to sink to a proper depth before the preselected amount of encapsulant has cured (70 degrees C. for 2 hours), wherein at least one electrical components of the electrical assembly of electrical components has at least one electrical lead and the proper depth allows said at least one electrical lead to remain substantially free of the encapsulant to create a module. Preferred processes may also comprise orienting the cap so that one of the at least one notch will extend alongside the first plurality of the electrical leads and another of the at least one notch will extend alongside the second plurality of electrical leads after step. Regarding the epoxy, the epoxy is preferably an amine cure epoxy that is comprised of fillers having fairly small particle sizes to enhance the leveling effect of the meniscus. Other changes can be made to increase the throughput of the manufacturing operations, such as loading a multitude of tubs into jig plates and adding inspection steps to inspect the finished product for quality control. Note that dispensing a controlled amount of encapsulant is important. The controlled amount may vary depending upon tub size and the size of electrical components as well as the accuracy of the equipment used to dispense the encapsulant.

The disclosed invention has the following advantages. The module system and related processes can be used to reduce the interference encapsulants (e.g., epoxy) with electrical leads of device packages. Another advantage is greater control of the encapsulant during the manufacturing process, which reduces the over fill and under fill and loss of parts. Similarly, the greater control of epoxy in conjunction with the preferred manufacturing steps, virtually eliminates the need for additional inspection and manufacturing steps to find problems and to rework the parts, such as the scraping of epoxy off of the leads. In addition, the use of the encapsulant (e.g., epoxy) extends the life of the electrical device in the presence of humidity in that it minimizes the ionic movement in electrical device and absorbs the battery electrolytes.

BRIEF DESCRIPTION OF THE DRAWINGS

Further features and advantages will become apparent from the following and more particular description of the various embodiments of the invention, as illustrated in the accompanying drawings, wherein:

FIG. 1C is a cross-sectional perspective view of preferred embodiments of electrical leads 4 of DIP 10 in FIG. 1A, showing the end and seating plane of electrical leads 4 in conjunction with electrical circuit 2 (e.g., a clock or timekeeping integrated circuit) embedded in DIP 10 and/or electrical circuit 1 packaged in DIP 10 enclosed in a cap 20 to form a module;

FIG. 1D highlights the preferred maximum and minimum level of epoxy encapsulate 22 when DIP 10 is placed in cap 20 in relation to electrical lead 4;

FIGS. 2A and 2B are a perspective views of a preferred embodiment of the improved circuit enclosure system, wherein the electrical circuit is packaged in a surface mount assembly, which is generally denoted by reference number 100;

FIGS. 3A, 3B, 3C1 and 3C2 show the preferred manufacturing procedure used manufacture module 1 (in FIGS. 1A and 1B);

DETAILED DESCRIPTION OF THE PREFERRED EMBODIMENTS

Figures 1A, 1B:
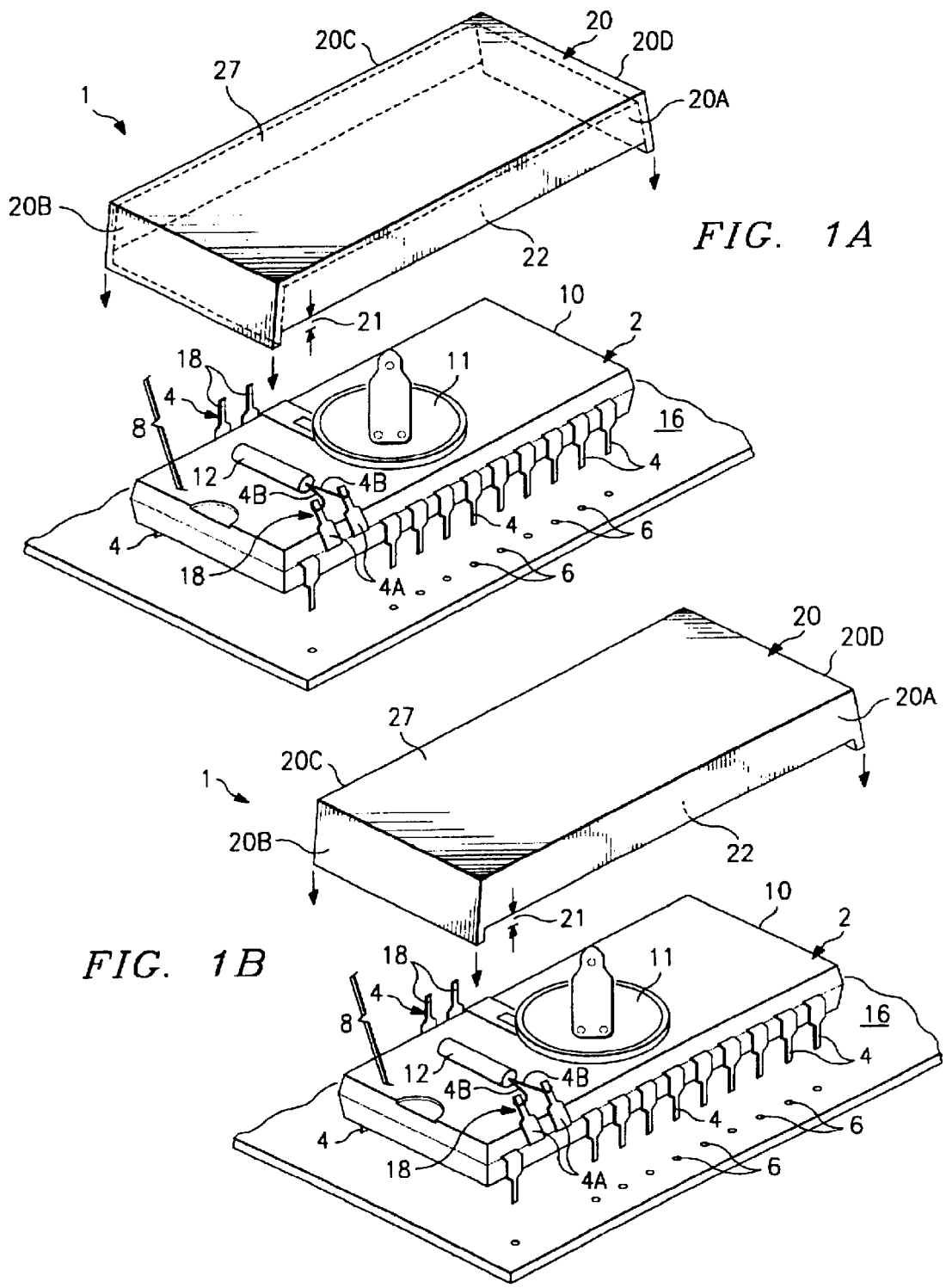
FIG. 1A is a perspective view of a preferred embodiment of the improved circuit enclosure system in which the electrical circuit 2 is packaged in a dual in-line package ("DIP") 10 generally denoted by reference number 1 having electrical leads 4, wherein cap 20 and DIP 10 is clear, so that elements are visible through cap 20 and DIP 10.
FIG. 1B is a perspective view of a preferred embodiment of the improved circuit enclosure system in which the electrical circuit 2 is packaged in a dual in-line package ("DIP") 10 generally denoted by reference number 1 having electrical leads 4, wherein cap 20 and DIP 10 are darkened, so that elements are not visible through cap 20 and DIP 10.
Figure 3A:
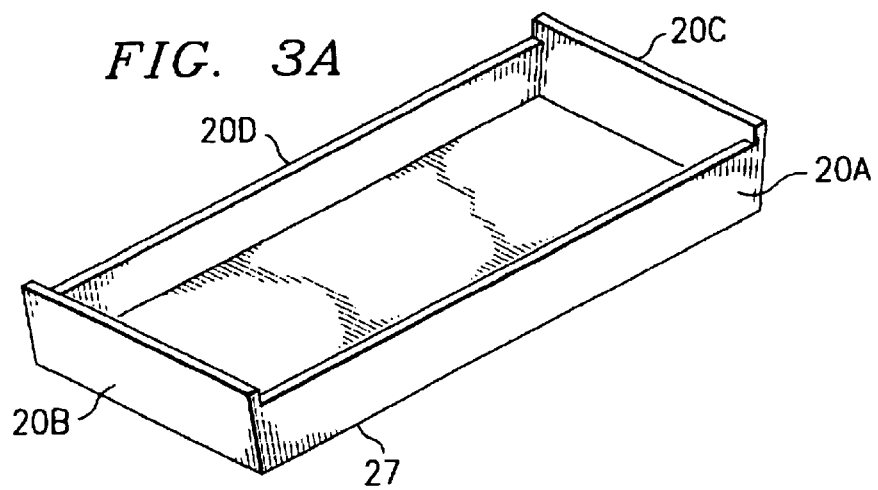
Figure 3B:
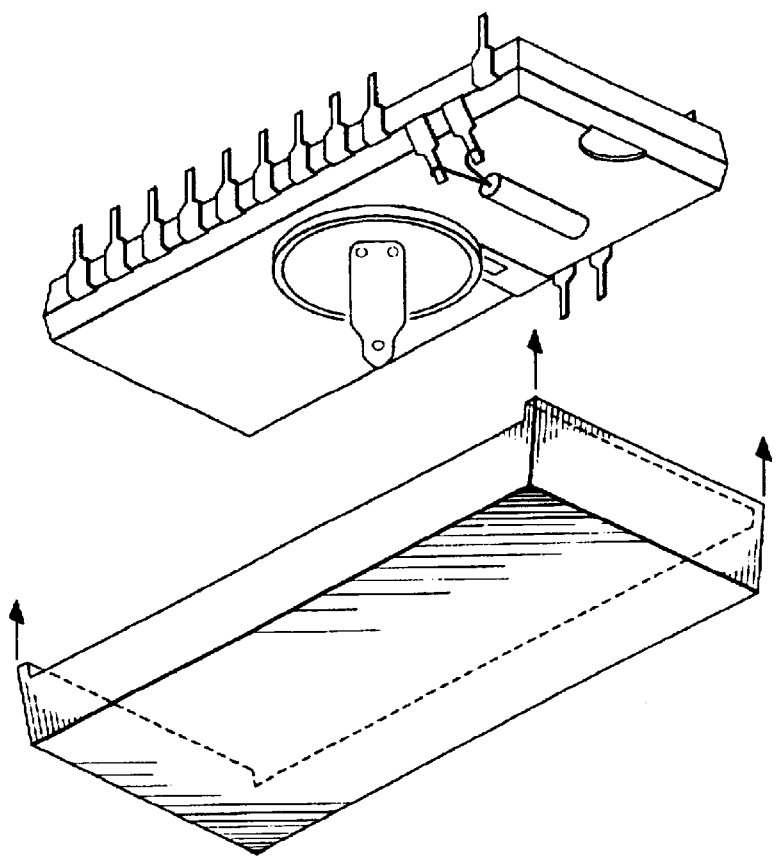

FIG. 1A is a perspective view of a preferred embodiment of the improved circuit enclosure system in which the electrical circuit 2 is packaged in a dual in-line package ("DIP") 10 generally denoted by reference number 1 having electrical leads 4, wherein tub or cap 20 and DIP 10 is clear, so that elements are visible through cap 20 and DIP 10. FIG. 1B is a perspective view of a preferred embodiment of the improved circuit enclosure system in which the electrical circuit 2 is packaged in a dual in-line package ("DIP") 10 generally denoted by reference number 1 having electrical leads 4, wherein cap 20 and DIP 10 are darkened, so that elements are not visible through cap 20 and DIP 10. In both FIGS. 1A and 1B, electrical module 1 is preferably comprised of an electrical circuit 2, which is preferably integrated into a single monolithic semiconductor substrate, such as silicon, and packaged in any number of packages, such as plastic leaded chip carrier ("PLCC") packages, quad flat pack ("QFP") packages, dual in-line packages ("DIP"), and other packages shown in Appendix A. Appendix A also shows the actual dimensions and number of pins for these packages. As shown in FIG. 1A, the dual in-line package 10 is the preferred package, but other packages may be used. However, as discussed below, some packages may work better than other packages for specific features of the preferred embodiments of the preferred enclosure system. As shown in FIG. 1A, DIP 10 has a plurality of electrical leads (e.g., 24 leads) extending out and away from DIP 10 itself. For DIP 10, this plurality of electrical leads 4 is typically broken into subpluralities of leads (e.g., 12), one set for two opposite sides). As shown in FIGS. 1A and 1B, electrical leads 4 may extend in any number of directions to contact necessary electrical contacts to couple DIP 10 to other electrical components 8 and/or other electrical systems (not shown) via printed circuit board 16. FIG. 1C is a cross-sectional perspective view of the placement preferred embodiments of electrical leads 4 of DIP 10 in FIG. 1A, showing the end and seating plane of electrical leads 4 in conjunction with electrical circuit 2 (e.g., a clock or timekeeping integrated circuit) embedded in DIP 10 and/or electrical circuit 2 packaged in DIP 10 enclosed in a cap 20 to form a module. More specifically, FIG. 1C highlights the relationship of the seating plane 13 in comparison to electrical circuit 2, DIP 10, cap 20, and module 1. Seating plane 13 generally shows the extent to which a socket or printed circuit board 16 travels down electrical leads 4 toward the electrical circuit 2, DIP 10, cap 20. This is important, because it is not generally desirable to have epoxy or similar encapsulant, as discussed below, leak out of cap 20 and travel down the electrical leads 4 past seating plane 13 at all, because the presence of the epoxy interferes with the electrical contact made by electrical leads 4 to other electrical contacts 16. FIG. 1D highlights the preferred maximum and minimum level of encapsulant 22 (e.g., epoxy, such as that manufactured by Grace Corporation) when encapsulant 22 is placed in cap 20 in relation to electrical lead 4.

Referring again to FIG. 1A, electrical circuit 2 typically has at least one electrical leads 4 extending out and away from electrical module 1 in order to make contact with external electrical contacts 6, such as those found in electrical socket (not shown in FIG. 1A) or on a printed circuit board 16 (e.g., soldered or wired electrical connections) that electrically couple circuitry embedded in electrical circuit 2 to external systems and the like. Preferred embodiments of electrical module 1 also generally comprise one or more additional electrical components 8 that are positioned proximate to the electrical circuit 2, such as battery 11 (e.g., lithium, NaCd, etc.), crystal 12, and/or a memory device (not shown). Note electrical leads 4B from crystal 12 are typically soldered to electrical leads 4A of plurality of electrical leads 4. Electrical components 8 are positioned proximate to the electrical circuit 2, such as battery 10, crystal 12, and/or memory device (not shown) within cap 20. Electrical components 8 also generally have electrical leads 18 extending outward and away from electrical components 8 in order to directly or indirectly contact electrical leads 4 of electrical circuit 2 to electrically couple electrical components 8 to electrical circuit 2. Electrical leads 18 may also electrically couple electrical components 8 to external systems via electrical circuit 2, electrical leads 4, and/or by themselves (in that electrical leads 18 may extend from the module themselves to directly contact external contacts). Tub or cap 20 is used to enclose electrical circuit 2 along with electrical components 8 (if present) to cover electrical circuit 2 and electrical components 8 and seal electrical circuit 2 and electrical components 8 together. Cap 20 also serves to package electrical circuit 2 and electrical components 8 as a single unit, and, when sealed correctly, protect them from damaging agents encountered in the manufacturing process as well as in the external environment (e.g., water). Cap 20 is preferably comprised of nylon, thermal plastic (LCP), glass filled polyester, and/or polyphenylene sulfide. Note cap 20 is multi-sided in that cap 20 may have one or more sidewalls 20A, 20B, etc. As shown in FIGS. 1A and 1B, cap 20 preferably has four sidewalls 20A, 20B, 20C, and 20D or two sets of two sidewalls opposite one another. Sidewalls 20A, 20B, 20C, and 20D join bottom surface 27 (or the top surface, depending upon your perspective). Each of sidewalls 20A, 20B, 20C, and 20D have an end connected to bottom surface 27 and another end. Alternate preferred embodiments may have a cap that has a smooth surface, so that there is not a clear line of demarcation between bottom surface 27 and the side sidewalls 20A, 20B, 20C, and 20D, which is typically the case when cap 20 is a hollow rectangular or cube structure with an open end, which allows objects, such as electrical components 8, to be placed therein. Note notch or reduced surface 21 on opposite sidewalls 20A and 20C, which correspond to the location of the two subpluralities of electrical leads 4 of DIP 10. The significance of this extended notch 21 will be explained below. Other changes can be made to increase the throughput of the manufacturing operations, such as loading a multitude of tubs into jig plates and adding inspection steps to inspect the finished product for quality control. Note dispensing a controlled amount of epoxy is important. The controlled amount may vary depending upon tub size and the size of electrical components as well as the accuracy of the equipment used to dispense the encapsulant. Moreover, alternate preferred embodiments may dispense encapsulant into tubs in stages.

As discussed above, electrical module 1 in FIG. 1A is typically positioned on and electrically coupled to electrical connections 6 found in a printed circuit board 16, which may contain a variety of other electrical components (not shown) electrically connected or bonded to the larger printed circuit board 16, such as microprocessors and memory chips.

Cap 20 is preferably filled with an encapsulant 22 (e.g., potting epoxy, such as that manufactured by Grace Corporation) which is used to seal and enclose integrated circuit 2 and electrical components 8 together. Encapsulating electrical components 8 in module 1 prevents or minimizes water (or other degrading cleaning solvents) from having ready access to the interior of the module, where it would short the battery and/or otherwise damage integrated circuit 2 and/or electrical components 8 contained in module 1, and also provides mechanical support for integrated circuit 2 and electrical components 8 enclosed therein and help hold all them all together. Encapsulant 22 is especially important to seal electrical components 8, when one of electrical components 8 is a battery 11, because battery 11 typically leaks and/or out-gases, which will significantly reduce its life expectancy. Encapsulant 22 addresses these battery leakage problems. Cap 20 along with epoxy 22 also secure electrical components 8 and electrical circuit 2 in DIP 10 together to provide additional mechanical security, such as damaging the components from handling or electrically shorting the components out (i.e., covering the anode and cathode of the battery, so that they cannot directly touch or come into contact with one another via dendrite growth or acerate projection across the two battery nodes). While electrical leads 4 may be comprised of any number of conductive materials that are preferably solderable, electrical leads 4 are preferably comprised of a tin lead alloy, which is extremely malleable or soft. As discussed above, it is not desirable to have encapsulate 20 on electrical leads 4, especially above or below (depending upon your perspective) the seating plane 13 (in FIG. 1C). Seating plane 13, thus, also defines the limits encapsulant 22 is permitted to travel down electrical leads 4. If it is present in these locations, it is typically removed with an Exactor™ knife or similar scraping device, which effectively scraps the outer solderable skin (e.g., fused or pre-melted tin-lead alloy applied to electrical leads by dipping or plating procedures) off of electrical leads 4. The base metal of electrical leads 4, such as using a nickel iron alloy (e.g., Alloy 42), does provide some rigidity, but these compositions are not generally solderable, which creates the need for the solderable skin. Part of this is due to encapsulant 22 is quite rigid or hard when cured, which is desirable when sealing together electrical components and electrical circuit 2 in package 10 under cap 20, but very difficult to scape off. In fact, when encapsulant 22 cures, the rigidity of fillers in encapsulant 22 (e.g., alumina trihydrate) is comparable to the rigidity of glass. The solderable skin in preferred embodiments of module 1 is preferably quite thin (e.g., approximately 500 micro in or 0.0005 in at its thickest location), as is the solder level applied, so it is generally quite easy to scrap the solderable skin off of electrical leads 4. For instance, the solder thickness preferably approaches 0.0005 inches thick. By comparison, the diameter of a human hair is generally 0.003 inches, so the solder layer is approximately ⅙ the diameter of a human hair. The thickness at the edges of the solder is even thinner.

FIGS. 2A and 2B are a perspective views of a preferred embodiment of the improved circuit enclosure system, wherein the electrical circuit is packaged in a surface mount assembly, which is generally denoted by reference number 100. The surface mount assembly 100, which is preferably enclosed by enhanced tub or cap 102. Please note that while FIGS. 2A and 2B shows lithium battery 106 positioned on a first surface 107A of first printed circuit board 107 and integrated circuits packaged in multiple SOIC packages 105 electrically coupled to electrical contacts in printed circuit board 107 via electrical leads 104. Other electrical components could be positioned elsewhere on either first surface 107A or second surface 107B. First printed circuit board 107 is preferably a thin (approximately 0.025" thick) multilayer design. In addition, as discussed above, encapsulant is used to seal and enclose the entire electrical assembly with cap 102. Encapsulant is placed inside cap 102 around electrical components inside cap 102.

Referring again to FIGS. 1A and 1B as well as FIGS. 3A, 3B, 3C1 and 3C2, the use of encapsulant 22 generally presents a number of problems. FIGS. 3A, 3B, 3C1 and 3C2 show the preferred manufacturing procedure used manufacture module 1 (in FIGS. 1A and 1B). Preferred manufacturing methods fill cap 20 with a specified amount of encapsulant 22 and then insert electrical circuit 2 packaged in a DIP 10 into an epoxy filled cap 20. If the human operator and/or automated equipment inserts DIP 10 too forcefully into the epoxy filled cap 20, epoxy 22 may bubble up or ooze out of cap 20. If this occurs, epoxy 22 may travel over the edge of one or more sidewalls 20A, 20B, 20C, or 20D of cap 20 and travel down external surface sidewalls 20A, 20B, 20C, and 20D of cap 20 and/or, as discussed above, cover a portion of electrical lead(s) 4 If epoxy 22 is present on the external surface of cap 20, it may disfigure cap 20 as well as attach or adhere to other unwanted devices (e.g., a table, handling tray, etc.) Until epoxy 22 cures, it will be sticky, which presents other manufacturing difficulties. When it cures, the epoxy is very hard and extremely difficult to remove. Similarly, if epoxy 22 is present on electrical lead(s) 4, especially if it is present above the enlarged portion 3 (in FIG. 1C) closest to the DIP 10 itself, epoxy 22 will interfere with the desired electrical connection between electrical circuit 2 (and/or electrical components 8) and external electrical systems. It is quite common for epoxy 22 to completely isolate or to break the electrical connection between electrical lead 4 from the external electrical system altogether. As a result, preferred manufacturing techniques do not forcefully insert DIP 10 into epoxy filled cap 20, but rather merely place DIP 10 on the surface of epoxy 22 present in cap 20 and let it naturally sink to a stable resting place. The amount and surface tension and viscosity of epoxy 22 and internal supporting ribs in cap 20 prevents DIP 10 from sinking too far into cap 20 and the speed of the descent does not encourage epoxy 22 to leak out of cap 20 onto electrical leads 4 or on external surface 27 of cap 20. Then, the epoxy 22 is cured by heating it to preselected temperatures and specified amounts of time. The temperatures and amount of time may vary, depending upon the nature of the electrical components (e.g., the battery) in the electrical assembly. The filling and heating steps can be subdivided or repeated as necessary. For instance, preferred processes generally fill preselected amounts of epoxy 22 in cap 20 on two separate occasions and/or cure epoxy 22 in two separate stages. Epoxy 22 is generally cured at 70 degrees Centigrade +/−5 degrees for approximately two hours, which is dictated by the maximum exposure a battery can tolerate.

Figure 4A:
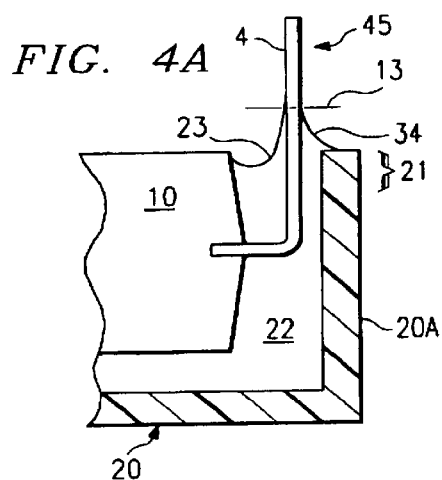
FIG. 4A is a side-view perspective of a preferred embodiment of an improved circuit enclosure system wherein the end of side 20A of cap 20 does not have a notch 21.
Figure 4B:
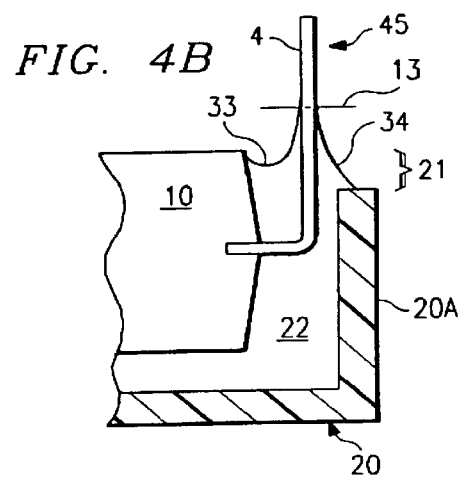
FIG. 4B is a side-view perspective of a preferred embodiment of an improved circuit enclosure system wherein the end of the side 20A of cap 20 does have notch 21.

FIG. 4A is a side-view perspective of a preferred embodiment of an improved circuit enclosure system wherein the end of side 20A of cap 20 does not have a notch 21. Likewise, FIG. 4B is a sideview perspective of a preferred embodiment of an improved circuit enclosure system wherein the end of the side 20A of cap 20 does have notch 21. FIGS. 4E and 4F show cross-sectional views of preferred embodiments of cap 20 without notch 21 (FIG. 4E) and with notch 21 (FIG. 4F). Referring to FIGS. 4B and 4F, note that lowering the edge of sidewall 20A (and 20C in FIGS. 1A and 1B) by a distance 21, which is equal to the depth of notch 21, effectively lowers the external encapsulant configuration 34 between sidewall 20A of cap 20 and electrical lead 4 and the internal encapsulant configuration 33 between DIP 10 and electrical lead 4 and discourages encapsulant 22 from traveling up or down (depending upon your perspective) electrical lead 4 by utilizing the surface tension to reduce the meniscus of epoxy 22, which is why preferred embodiments have at least one notch 21. In short, notch 21 provides an anchor or base for epoxy 22. The surface tension of epoxy 22 effectively pulls epoxy 22 down or up electrical lead 4 (depending upon your perspective). By comparison, note in FIGS. 4A and 4E that a raising the edge of sidewall 20A (and 20C in FIGS. 1A and 1B) by a distance 21, which is equal to the depth of notch 21, effectively raises the external encapsulant configuration 24 between sidewall 20A of cap 20 and electrical lead 4 and the internal encapsulant configuration 23 between DIP 10 and electrical lead 4 and encourages encapsulant 22 to travel up or down (depending upon your perspective) electrical lead 4.

Creating the notch 21 effectively moves the support system for the sidewall 20A. The surface tension of the encapsulant 22 and the sidewall structure with the notch 21 moves the encapsulant away from the portion of the electrical lead 4 that is used for connection to outside circuits from electrical lead 4, so electrical lead 4 does not have to be scraped. Also, note notch 21 is preferably positioned alongside or on the same respective side of DIP 10 that has electrical leads 4 extending therefrom, so a cap 20 may have one or more notches positioned on one or more sidewalls 20A, 20B, 20C, etc., depending on the location and nature of electrical leads 4 and the physical make-up of encapsulant 22. Preferred embodiments of notch 21, however, are not so deep that the base of electrical leads 4, which is connected to and extends from DIP 10 is exposed. Epoxy 22 and cap 20 (and the module 1 resulting therefrom) combine to support electrical leads 4 when the resulting module 1 is inserted into a socket or the like. This support is enhanced when electrical assembly is properly inserted to the appropriate seating plane, which generally corresponds with to edge of sidewalls 20A, 20B, 20C, and 20D.

Figure 4C:
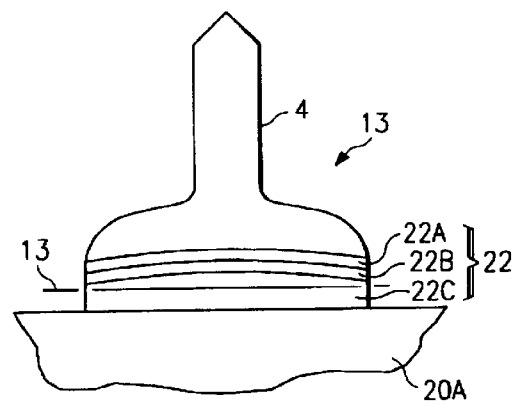
FIGS. 4C and 4D show the height of the meniscus for epoxy encapsulant 22 on electrical lead 4 without and with notch 21 in sidewall 20A of cap 20.
Figure 4D:
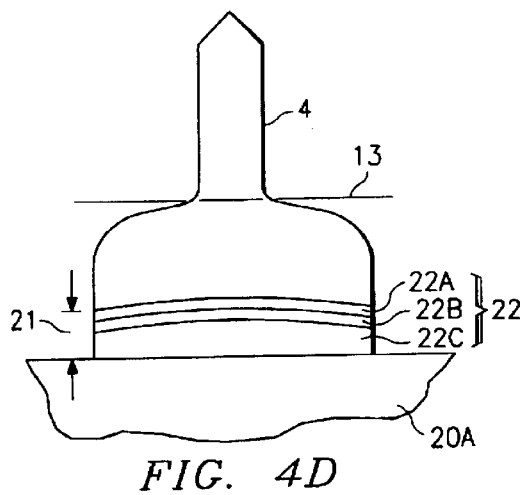
Figure 4E:
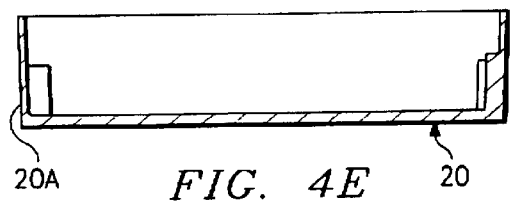
FIGS. 4E and 4F show cross-sectional views of preferred embodiments of cap 20 without notch 21 (FIG. 4E) and with notch 21 (FIG. 4F)
Figure 4F:
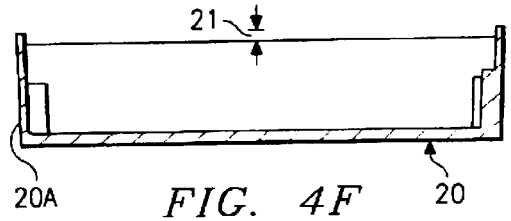

By comparison, FIGS. 4C and 4D show the height of the meniscus for encapsulant 22 on electrical lead 4 without and with notch 21 in sidewall 20A of cap 20. FIG. 4C corresponds to the configuration shown in FIG. 4A and FIG. 4D corresponds to the configuration shown in FIG. 4B. FIG. 4D shows the lower height of the meniscus or encapsulant configuration 44 by comparison to FIG. 4C. Note, if examined up close, the thickness and nature of the particles of the encapsulant forming the meniscus actually varies, as lighter particles float upward toward the end of electrical lead 4. More specifically, part of this variance can be explained by the weight or mass of particulate matter comprising the epoxy 22 itself. The meniscus of the epoxy generally separates into a series of bands: 22A, 22B, and 22C that typically confirm to a parabolic shape with the highest point approximately positioned in the center of electrical leads 4. The material content of each band varies, as compounds having smaller particular matter generally float to the surface of epoxy 22 as it cures. Preferred encapsulants are epoxies that are generally amine cure epoxies and are comprised of hydrocarbon compounds (catalyst and resin), fillers, pigments (carbon), and flame retardants. Fillers, such as alumina trihydrate, which have a small particle size (0.25 microns), generally float to the surface of epoxy 22 where it helps load down the surface to cause a leveling effect. Thus, if more fillers having smaller particle size are added to the epoxy 22 before it is placed inside cap 20, more of these smaller particles will float or rise to the surface, which weighs down the surface of epoxy 22 and indirectly increases the surface tension of epoxy 22 and enhances this leveling effect of the meniscus.

As the above discussion illustrates, the make-up of the epoxy 22 is another important concern in assembling circuit enclosure systems and keeping as much epoxy 22 off electrical leads 4 as possible.

FURTHER MODIFICATIONS AND VARIATIONS

Although the invention has been described with reference to a specific embodiment, this description is not meant to be construed in a limiting sense. In addition, in light of the fact many of the innovative concepts disclosed in this patent application are independent from one another, all of the innovative concepts should be treated as distinct from one another. None of the innovative concepts should be viewed as relying on another innovative concept. In other words, preferred embodiments and manufacturing procedures do not necessarily include each an every innovative concept. In other words, the fact Applicants described these inventions together should not be construed in a limiting sense whatsoever. As described above, various modifications of the disclosed embodiment as well an alternate embodiments of the invention will become apparent to persons skilled in the art upon reference to the description of the invention. Accordingly, it should be understood that the modifications and variations suggested above and below are not intended to be exhaustive. These examples help show the scope of the inventive concepts, which are covered in the appended claims. The appended claims are intended to cover these modifications and alternate embodiments.

What is claimed is:

1. An electronic module, comprising:
   (a) an electrical assembly of a plurality of electrical components, wherein at least one electrical component of said electrical assembly of electrical components comprising at least a first integrated circuit and packaged in a package having at least one electrical lead electrically coupled to said integrated circuit and extending outward and away from said package and said electrical assembly of electrical components and at least one other electrical component which is not fabricated on the same semiconductor substrate as the semiconductor substrate on which said first integrated circuit has been fabricated; and
   (b) a cap surrounding a portion of said electrical assembly of electrical components to form a pocket between a portion of said electrical assembly of electrical components and said cap, said cap having at least one sidewall, each of said at least one sidewalls having an end, one of at least one sidewalls proximately positioned to said at least one electrical lead and having at least one notch positioned in said end, said pocket filled with an encapsulant.

2. The module of claim 1, wherein said electrical assembly of electrical components is comprised of electrical components selected from the group consisting of integrated circuits, batteries, crystals, volatile memory, and clock circuits.

3. The module of claim 1, wherein said package is a dual inline package having four sides and said at least one electrical lead is comprised of a first plurality of electrical leads positioned on one side of said four sides and said second plurality of electrical leads positioned on another side of said four sides that is opposite said one side of said four sides.

4. The module of claim 1, wherein the number of said at least one electrical lead is greater than one and said greater than one electrical leads are provided into at least two groups of leads, and wherein one of said at least one notch extends alongside said first group of said plurality of said electrical leads and another of said at least one notch extends alongside said second group of said plurality of electrical leads.

5. The module of claim 1, wherein said at least one electrical lead electrically couples at least one electrical component of said electrical assembly to a printed circuit board.

6. The module of claim 5, wherein said at least one electrical lead electrically couples at least one electrical component of said electrical assembly to a second electrical assembly of electrical components via said printed circuit board.

7. The module of claim 1, wherein said encapsulant is comprised of epoxy.

8. The module of claim 7, wherein said epoxy is an amine cure epoxy that is comprised of fillers having variously controlled particle size.

9. The module of claim 1, wherein said at least one electrical lead electrically couples at least one electrical component of said electrical assembly to a socket mounted on a printed circuit board.

* * * * *